United States Patent
Moon et al.

(10) Patent No.: US 9,357,630 B2
(45) Date of Patent: May 31, 2016

(54) EPOXY RESIN COMPOUND AND RADIANT HEAT CIRCUIT BOARD USING THE SAME

(75) Inventors: Sung Bae Moon, Seoul (KR); Jae Man Park, Seoul (KR); Jong Heum Yoon, Seoul (KR); Hae Yeon Kim, Seoul (KR); In Hee Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 110 days.

(21) Appl. No.: 14/235,692

(22) PCT Filed: Jul. 27, 2012

(86) PCT No.: PCT/KR2012/006041
§ 371 (c)(1),
(2), (4) Date: Jun. 16, 2014

(87) PCT Pub. No.: WO2013/015659
PCT Pub. Date: Jan. 31, 2013

(65) Prior Publication Data
US 2014/0318839 A1  Oct. 30, 2014

(30) Foreign Application Priority Data

Jul. 28, 2011  (KR) .................. 10-2011-0075462

(51) Int. Cl.
| | |
|---|---|
| *C08G 59/18* | (2006.01) |
| *C08G 59/20* | (2006.01) |
| *C08G 59/50* | (2006.01) |
| *C08L 63/00* | (2006.01) |
| *H05K 1/05* | (2006.01) |
| *H01L 23/14* | (2006.01) |
| *H01L 23/373* | (2006.01) |

(Continued)

(52) U.S. Cl.
CPC ............ *H05K 1/0201* (2013.01); *C08G 59/184* (2013.01); *C08L 63/00* (2013.01); *H01L 23/142* (2013.01); *H01L 23/3737* (2013.01); *H05K 1/0373* (2013.01); *H05K 1/056* (2013.01); *H01L 2924/0002* (2013.01); *H05K 2201/0209* (2013.01)

(58) Field of Classification Search
CPC ................................ C08L 63/00; C08G 59/00
See application file for complete search history.

(56) References Cited

U.S. PATENT DOCUMENTS 4,330,659 A * 5/1982 King et al. ...................... 528/99
2002/0187321 A1 12/2002 Hirano et al.
(Continued)

FOREIGN PATENT DOCUMENTS

| CN | 1396800 A | 2/2003 |
|---|---|---|
| CN | 1958719 A | 5/2007 |

(Continued)

OTHER PUBLICATIONS

Miroyannidis, "Synthesis, characterization and polymerization of new epoxy compounds containing azomethine linkages,"(1989), Makrolmol. Chem. vol. 190, pp. 1867-1879.*

(Continued)

*Primary Examiner* — Randy Gulakowski
*Assistant Examiner* — Ha Nguyen
(74) *Attorney, Agent, or Firm* — Saliwanchik, Lloyd & Eisenschenk

(57) ABSTRACT

Disclosed are an epoxy resin compound and a radiant heat circuit board using the same. The epoxy resin compound mainly includes an epoxy resin, a curing agent, and an inorganic filler. The curing agent comprises epoxy adducts formed to add the curing agent to a crystalline epoxy resin. The epoxy resin is used on a printed circuit board as an insulating material, so that a substrate having a high heat radiation property is provided.

10 Claims, 1 Drawing Sheet

(51) Int. Cl.
*H05K 1/02* (2006.01)
*H05K 1/03* (2006.01)

(56) References Cited

U.S. PATENT DOCUMENTS

| | | | |
|---|---|---|---|
| 2004/0102597 A1 | 5/2004 | Tobita et al. | |
| 2004/0157961 A1* | 8/2004 | Tullos et al. | 523/400 |
| 2004/0224163 A1* | 11/2004 | Tobita et al. | 428/413 |
| 2011/0122336 A1* | 5/2011 | Lee et al. | 349/61 |
| 2012/0127684 A1 | 5/2012 | Matsumoto et al. | |

FOREIGN PATENT DOCUMENTS

| | | |
|---|---|---|
| EP | 1795558 A1 | 6/2007 |
| JP | 2000327883 A | 11/2000 |
| JP | 2001288338 A | 10/2001 |
| JP | 2009203261 A | 9/2009 |
| JP | 2010070720 A | 4/2010 |
| JP | 2011-077224 A | 4/2011 |
| KR | 899720 B1 * | 5/2009 |
| TW | I339424 B | 3/2011 |

OTHER PUBLICATIONS

International Search Report in International Application No. PCT/KR2012/006041, filed Jul. 27, 2012.

Office Action dated Nov. 12, 2014 in Taiwanese Application No. 10321571380.

Office Action dated Jun. 30, 2015 in Chinese Application No. 201280047409.8.

* cited by examiner

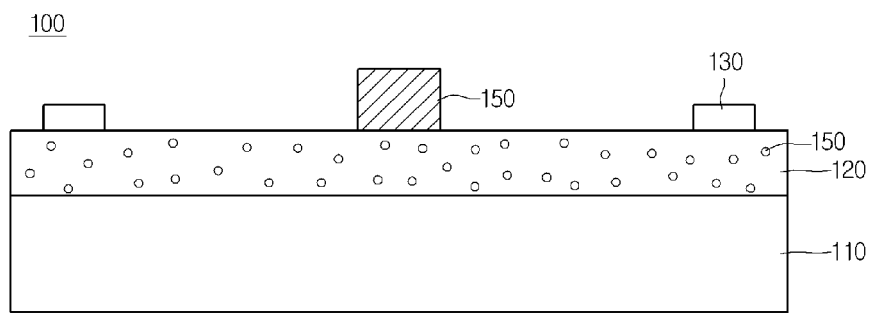

EPOXY RESIN COMPOUND AND RADIANT HEAT CIRCUIT BOARD USING THE SAME

CROSS-REFERENCE TO RELATED APPLICATIONS

This application is the U.S. national stage application of International Patent Application No. PCT/KR2012/006041, filed Jul. 27, 2012, which claims priority to Korean Application No. 10-2011-0075462, filed Jul. 28, 2011, the disclosures of each of which are incorporated herein by reference in their entirety.

TECHNICAL FIELD

The disclosure relates to an epoxy resin compound. In more particular, the disclosure relates to an epoxy resin compound used as an insulating layer of a radiant heat circuit board.

BACKGROUND ART

A circuit board includes a circuit pattern mounted on an electric insulating substrate, and is used to mount electronic parts thereon.

The electronic parts may include a heat emitting device, for example, a light emitting diode (LED), and the heat emitting device significantly emits heat. The heat emitted from the heat emitting device increases the temperature of the circuit board to cause the erroneous operation of the heat light emitting device and to degrade the reliability of the heat emitting device.

Therefore, in the circuit board, a heat radiation structure to emit heat from the electronic parts to the outside is important, and the thermal conductivity of the insulating layer formed in the circuit board exerts a great influence on the circuit board.

In order to enhance the thermal conductivity of the insulating layer, an inorganic filler must be filled in the insulating layer at a high density. To this end, epoxy resin representing low viscosity has been suggested.

As the low-viscosity epoxy resin, bisphenol A epoxy resin and bisphenol F epoxy resin are generally extensively used. Since the above epoxy resin is in a liquid phase at a room temperature, the handling of the above epoxy resin is difficult, and the above epoxy resin represents weak heat resistance, mechanical strength, and tensile force.

DISCLOSURE OF INVENTION

Technical Problem

The embodiment provides an epoxy resin compound having a novel composition.

The embodiment provides a radiant heat circuit board capable of improving heat efficiency.

Solution to Problem

According to the embodiment, an epoxy resin compound mainly includes epoxy resin, a curing agent, and an inorganic filler. The epoxy resin includes a crystalline epoxy resin and the curing agent includes an epoxy adduct adding the curing agent to the crystalline epoxy resin.

Meanwhile, according to the embodiment, a radiant circuit board includes a metallic plate, an insulating layer on the metallic plate, and a circuit pattern on the insulating layer. The insulating layer is formed by curing an epoxy resin compound mainly including epoxy resin, a curing agent, and an inorganic filler, and the epoxy resin includes a crystalline epoxy resin and the curing agent includes an epoxy adduct adding the curing agent to the crystalline epoxy resin.

Advantageous Effects of Invention

As described above, according to the embodiment, thermal conductivity of the radiant heat circuit board can be increased by using the epoxy resin including a mesogen structure to enhance a crystalline. In addition, the epoxy resin serving as an insulating material is used for the printed circuit board so that the substrate having a high heat radiation property can be provided. In addition, the epoxy adducts is formed the curing agent added to the crystalline epoxy resin, so that the solubility of the crystalline epoxy resin can be improved. And the amount used of curing agent decreases, so that the settlement can be improved.

The crystalline epoxy resin represents a superior molding property and a superior reliability, and represents high thermal conductivity, a low absorbable property, a low thermal expansion property, and a high heat resistance.

BRIEF DESCRIPTION OF DRAWINGS

FIG. 1 is a sectional view showing a radiant heat circuit board according to the disclosure.

BEST MODE FOR CARRYING OUT THE INVENTION

Hereinafter, embodiments will be described in detail with reference to accompanying drawings so that those skilled in the art can easily work with the embodiments. However, the embodiments may have various modifications.

In the following description, when a predetermined part includes a predetermined component, the predetermined part does not exclude other components, but may further include other components if there is a specific opposite description.

The thickness and size of each layer shown in the drawings may be exaggerated, omitted or schematically drawn for the purpose of convenience or clarity. In addition, the size of elements does not utterly reflect an actual size. The same reference numbers will be assigned the same elements throughout the drawings.

In the description of the embodiments, it will be understood that, when a layer, a film, a region, or a plate is referred to as being on or under another layer, another film, another region, or another plate, it can be directly or indirectly on the other layer, film, region, plate, or one or more intervening layers may also be present. Such a position of the layer has been described with reference to the drawings.

The disclosure provides an epoxy resin compound having improved thermal conductivity due to high crystalline.

Hereinafter, the crystalline epoxy resin compound of the disclosure mainly comprises epoxy resin, an epoxy adduct, and an inorganic filler.

The crystalline epoxy resin compound comprises 2 w % to 50 w % of the epoxy resin.

Epoxy resin may comprise at least 5 w % of crystalline epoxy resin. Preferably, epoxy resin may comprise at least 50 w % of crystalline epoxy.

In this case, the crystalline epoxy resin is represented by the following chemical formula.

ChemistryFIG. 1

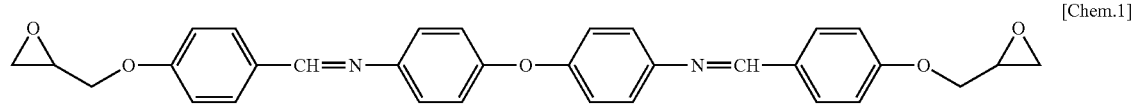

[Chem.1]

If the used ratio of the crystalline epoxy resin is less than the above ratio, when the crystalline epoxy resin is cured, the crystalline epoxy resin may be not crystallized, so that low thermal conductivity may be represented.

In addition to the crystalline epoxy resin employed as an essential component of the disclosure, the epoxy resin typically comprises different non-crystalline epoxy resins having at least two epoxy groups in a molecular thereof.

For example, the non-crystalline epoxy resin comprises bisphenol A, 3,3',5,5'-tetramethyl-4,4'-dihydroxydiphenylmethane, 4,4'-dihydroxydiphenylsulphone, 4,4'-dihydroxydiphenyl sulfide, 4,4'-dihydroxydiphenylketone, fluorenebisphenol, 4,4'-biphenol, 3,3',5,5'-tetramethyl-4,4'-dihydroxybiphenyl, 2,2'-biphenol, resorcine, catechol, t-butylcatechol, hydroquinone, t-butyl hydroquinone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, allylide or poly allylate of the dihydroxynaphthalene, divanlent phenols such as allylated bisphenol A, allylated bisphenol F, or allylated phenol-novolac, trivalent or higher phenols such as phenol-novolac, bisphenol A novolac, o-cresol novolac, m-cresol novolac, p-cresol novolac, xylenol novolac, poly-p-polyhydroxystyrene, tris-(4-hydroxyphenyl)methane, 1,1,2,2-tetrakis(4-hydroxyphenyl)ethane, fluorglycinol, pirogallol, t-butylpirogallol, allylated pirogallol, poly allylated pirogallol, 1,2,4-benzenetryol, 2,3,4-trihydroxybenzophenone, phenol aralkyl resin, naphtol aralkyl resin, and dicyclopentadiene-based resin, or glycidyletherifide product derived from halogenated bisphenols such as tetrabromobisphenol A. One of the above non-crystalline epoxy resin may be used, or at least two kinds of the non-crystalline epoxy resins may be mixed with each other for use.

The epoxy resin compound of the embodiment comprises 0.5-10 w % of the curing agent based on a total weight of the epoxy resin compound.

The curing agent comprises the epoxy adducts.

The curing agent includes the epoxy adducts formed to add the curing agent to the crystalline epoxy resin, so that the solubility of the crystalline epoxy resin can be improved.

In this case, the epoxy adducts are represented by the following chemical formula.

ChemistryFIG. 2

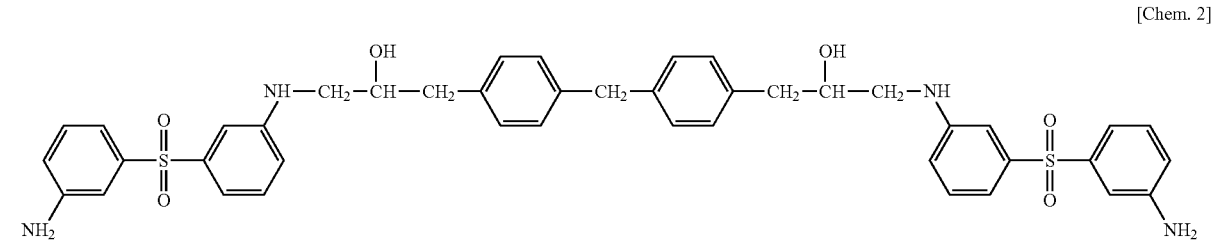

[Chem. 2]

ChemistryFIG. 3

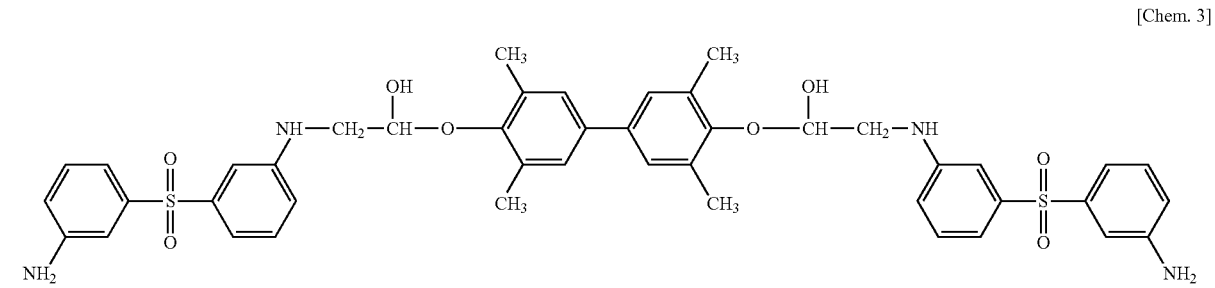

[Chem. 3]

The epoxy adducts of Chemical Formula 2 and 3 would be formed to stir crystalline epoxy monomer and the curing agent in high temperature for 5 to 10 hours.

The epoxy adducts of Chemical Formula 2 and 3 may be phenol-based curing agent, but the invention is not limited thereto.

The epoxy adducts is 0.5 to 5 w % based on a total weight of the epoxy resin compound. And the curing agent may be added generally-known epoxy resin curing agents.

When the epoxy adducts is less than 0.5 w % based on a total weight of the epoxy resin compound, the resin is oriented irregularly, and the curing density is low so that the epoxy resin compound cannot represent high thermal conductivity, a low thermal expansion property, and a high heat resistance.

When the epoxy adducts is more than 0.5 w % based on a total weight of the epoxy resin compound, the resin content is effect on the epoxy adducts, so that thermal conductivity gets lower and adhesion to the substrate declines by overcuring.

The curing agent added to the epoxy adducts according to the disclosure may comprise all generally-known epoxy resin curing agents. Preferably, the curing agent may include a phenol-based curing agent.

The phenol-based curing agent includes a phenol resin as well as a phenol compound among single compounds of phenolic compounds.

For example, a phenol-based curing agent may comprise bisphenol A, bisphenol F, 4,4'-dihydroxydiphenylmethane, 4,4'-dihydroxydiphenylether, 1,4-bis(4-hydroxyphenoxy)benzene, 1,3-bis(4-hydroxyphenoxy)benzene, 4,4'-dihydroxydiphenyl sulfide, 4,4'-dihydroxydiphenylketone, 4,4'-dihydroxydiphenylsulphone, 4,4'-dihydroxybiphenyl, 2,2'-dihydroxybiphenyl, 10-(2,5-dihydroxyphenyl)-10H-9-oxa-10-phosphaphenanthrene-10-oxide, phenol-novolac, bisphenol A novolac, o-cresol novolac, m-cresol novolac, p-cresol novolac, xylenol novolac, poly-p-polyhydroxystyrene, hydroquinone, resorcine, catechol, t-butylcatechol, t-butyl hydroquinone, fluorglycinol, pirogallol, t-butylpirogallol, allylated pirogallol, poly allylated pirogallol, 1,2,4-benzenetryol, 2,3,4-trihydroxybenzophenone, 1,2-dihydroxynaphthalene, 1,3-dihydroxynaphthalene, 1,4-dihydroxynaphthalene, 1,5-dihydroxynaphthalene, 1,6-dihydroxynaphthalene, 1,7-dihydroxynaphthalene, 1,8-dihydroxynaphthalene, 2,3-dihydroxynaphthalene, 2,4-dihydroxynaphthalene, 2,5-dihydroxynaphthalene, 2,6-dihydroxynaphthalene, 2,7-dihydroxynaphthalene, 2,8-dihydroxynaphthalene, allylide or poly allylate of the dihydroxynaphthalene, allylated bisphenol A, allylated bisphenol F, allylated phenol-novolac, or allylated pirogallol.

The curing agent may comprise at least two curing agents.

Meanwhile, other than the phenol-based curing agent, the curing agent may comprise generally-known curing agents. For example, the curing agent may comprise an amine-based curing agent, an acid anhydride-based curing agent, a phenol-based curing agent, a polymercaptan-based curing agent, a polyaminoamide-based curing agent, an isocyanate-based curing agent, and a blocked isocyanate-curing agent. The mixed amount of the above curing agents may be properly set by taking the types of curing agents to be mixed or the physical property of a thermal conductive epoxy resin molding to be obtained through the mixing into consideration.

For example, an amine-based curing agent may comprise aliphatic amines, polyether polyamines, alicyclic amines, or aromatic amines. The aliphatic amines may comprise ethylenediamine, 1,3-diaminopropane, 1,4-diaminopropane, hexamethylenediamine, 2,5-dimethyl hexamethylene diamine, trimethyl-hexamethylenediamine, diethylene triamine, iminobispropylamine, bis(hexamethylene)triamine, triethylenetetramine, tetraethylenephentermine, pentaethylenehexamine, N-hydroxyethylethylenediamine, or tetra(hydroxyethyl)ethylenediamine. The polyether polyamines may comprise triethylene glycol diamine, tetraethylene glycol diamine, diethylene glycol bis(propylamine), polyoxy-propylene diamine, or polyoxypropylenetriamines. The alicyclic amines may comprise isophoronediamine, methenediamine, N-aminoethylpiperazine, bis(4-amino-3-methyldicyclohexy)methane, bis(aminomethyl)cyclohexane, 3,9-bis(3-aminopropyl)2,4,8,10-tetraoxaspiro(5,5)undecane, or nor-bornenediamine. The aromatic amines may comprise tetrachloro-p-xylenediamine, m-xylenediamine, p-xylenediamine, m-phenylenediamine, o-phenylenediamine, p-phenylenediamine, 2,4-diaminoanisole, 2,4-toluenediamine, 2,4-diaminodiphenylmethane, 4,4'-diaminodiphenylmethane, 4,4'-diamino-1,2-diphenylethane, 2,4-diaminodiphenylsulfone, 4,4'-diaminodiphenylsulfone, m-aminophenol, m-aminobenzylamine, benzyldimethylamine, 2-dimethylaminomethyl)phenol, triethanolamine, methylbenzylamine, -(m-amionphenyl)ethylamine, -(p-amionphenyl)ethylamine, diaminodiethyldimethyldiphenylmethane, or, '-bis(4-amionphenyl)-p-diisopropylbezene.

For example, an acid anhydride-based curing agent may comprise, dodesenil anhydride succinate, polyadipicacidanhydride, polyazelaic acid anhydride, polysebacic acidanhydride, poly(ethyloctadecanoicacid)anhydride, poly(phenylhexadecanoicacid)anhydride, methyltetra-hydrophthalic anhydride, methylhexahydrophthalicanhydride, hexahydrophthalicanhydride, anhydrous methylhymicacid, tetrahydrophthalicanhydride, trialkyltetrahydrophthalicanhydride, methylcyclohexenedicarboxylicacidanhydride, methylcyclohexenetetracarboxylicacidanhydride, phthalicanhydride, trimelliticanhydride, pyromelliticanhydride, benzophenonetetracarboxylicacidanhydride, ethyleneglycolbistrytrimellitate, heticacidanhydride, nadicacidanhydride, methylnadicacidanhydride, 5-(2,5-dioxotetrahydro-3-furanyl)-3-methyl-3-cyclohexanane-1,2-dicarboxylic acid anhydride, 3,4-dicarboxylic-1,2,3,4-tetrahydro-1-naphthalenesuccinate dianhydride, or 1-methyl-dicarboxylic-1,2,3,4-tetrahydro-1-aphthalenesuccinate dianhydride.

The epoxy resin compound comprises 40 w % to 95 w % of an inorganic filler based on the total weight of the epoxy resin compound.

If the content of the filler is less than the above range, the object of the disclosure to acquire high thermal conductivity, low thermal expansion, or high heat resistance may not be sufficiently achieved. The effects may be more strongly represented as the content of the inorganic filler is increased. In this case, the effects are not improved in proportion to the volume fraction of the inorganic filler, but are exponentially improved from a specific content. The physical properties are represented by effects resulting from the hyper-structure control in a polymer state. Since the hyper-structure is obtained on the surface of the inorganic filler, the specific content of the inorganic filler is required. Meanwhile, if the content of the filler is more than the above range, viscosity is increased, so that moldability is undesirably degraded.

Preferably, the inorganic filler has a spherical shape. The spherical-shape inorganic filler comprises an inorganic filler having an oval sectional surface. Accordingly, the inorganic filler may include various inorganic fillers having a sphere-like shape. However, the inorganic filler more preferably has an almost full sphere shape in terms of liquidity.

The inorganic filler may comprise alumina, aluminum nitride, silicon nitride, boron nitride, or crystalline silica. The inorganic filler may include the mixture of at least two inorganic fillers different from each other.

The average particle diameter of the inorganic filler is preferably 30 or less. If the average particle diameter of the inorganic filler is greater than 30, the liquidity and the strength of the epoxy resin compound are undesirably degraded.

The epoxy resin compound according to the disclosure may be mixed with a generally-known curing accelerator. The curing accelerator may include amines, imidazoles, organic phosphines, or lewis acid. In detail, the curing accelerator may include tertiary amine such as 1,8-diazabicyclo(5,4,0)

undecane-7, triethylenediamine, benzyl dimethylamine, triethanol amine, dimethylaminoethanol, or tris(dimethylaminomethyl)phenol, imidazoles such as 2-methylimidazole, 2-phenylimidazole, 2-phenyl-4-methylimidazole, and 2-heptadecylimidazole, organic phosphines such as tributylphosphine, methyldiphenylphosphine, triphenylphosphine, diphenylphosphine, and phenylphosphine, tetra subphosphonium tetra subborate such as tetraphenylphosphoniumtetraphenylborate, tetraphenylphosphoniumethyltryphenyl borate, or tetrabutylphosphonium tetrabutyl borate, or tetraphenylboronsalt such as 2-ethyl-4-methyl imidazoletetraphenylborate, or N-methylmorpholin tetraphenylborate.

The epoxy resin compound according to the disclosure may comprise a wax serving as a typical release agent used for the epoxy resin compound according to the disclosure. For example, the wax may comprise stearic acid, montanic acid, montanic acid ester, or phosphate ester.

The epoxy resin compound according to the disclosure may comprise a typical coupling agent used for the epoxy resin compound in order to improve the adhesive strength between the inorganic filler and the resin component. For example, the coupling agent may comprise epoxy silane.

When the epoxy resin compound according to the disclosure mainly includes epoxy resin, a curing agent, and an inorganic filler, the epoxy resin compound includes 5 wt % to 50 w % of the epoxy resin, 40 w % to 95 w % of the inorganic filler, and 0.5 w % to 10 w % of the curing agent based on the total weight of the epoxy resin compound.

After the epoxy resin, the curing agent, and the rubber additive are melted in a solvent such as acetone, MEK, MIBK, IPA, butanol, or toluene, the epoxy resin, the curing agent, and the rubber additive are stirred while being heated. Then, the inorganic filler is put into the above stirred result and uniformly mixed together by a mixer. Thereafter, the coupling agent is added and mixed and pasted by a heating roller and a needer, so that the epoxy resin compound is prepared. The components may be mixed with each other in various sequences.

In this case, the solvent has the content of about 10 w % to 20 w % based on the total weight of the epoxy resin compound.

The epoxy resin compound according to the disclosure is adaptable to a radiant heat circuit board of FIG. 1.

Referring to FIG. 1, a radiant heat circuit board 100 according to the disclosure comprises a metallic plate 110, an insulating layer 120 formed on the metallic plate 110, and a circuit pattern 130 formed on the insulating layer 120.

The metallic plate 110 may comprise one of alloys including copper (Cu), aluminum (Al), nickel (Ni), gold (Au), or platinum (Pt) representing superior thermal conductivity.

The metallic plate 110 may comprise a metallic protrusion (not shown) constituting a mounting pad on which a heat emitting device 150 is mounted.

The metallic protrusion protrudes perpendicularly to the metallic plate 110 while extending from the metallic plate 110. A portion of the top surface of the metallic protrusion serves as the mounting pad on which the heat emitting device 150 is mounted, and has a predetermined width to the extent that a solder may be provided on the top surface of the metallic protrusion.

The insulating layer 120 is formed on the metallic plate 110.

The insulating layer 120 may comprise a plurality of insulating layers, and insulates the metallic plate 110 from the circuit pattern 130 formed on the insulating layer 120.

The insulating layer 120 may be formed by curing the crystalline epoxy resin compound suggested in the disclosure, and inorganic fillers 125 are uniformly dispersed in the insulating layer 120.

A plurality of circuit patterns 130 are formed on the insulating layer 120.

The insulating layer 120 according to the disclosure is formed by using the crystalline epoxy resin compound, so that the thermal conductivity can be improved. Accordingly, the heat from the heat emitting device 150 is transferred to the metallic plate 110 at the lower portion of the radiant heat circuit board 100.

EMBODIMENTS

Hereinafter, the disclosure will be described in more detail by embodiments.

The thermal conductivity was measured through an abnormal heat conduction scheme by using an LFA447-type thermal conductivity meter manufactured by NETZSCH.

An Al peel property was represented as the delmaination degree of an epoxy resin compound when the epoxy resin compound was coated on an Al substrate and cured, and then the Al substrate was bent at 180 degrees and recovered to an original position. If the delamination degree is less than 0.2 cm, is marked. If the delamination degree is in the range of 0.2 cm to 1 cm, is marked. If the delamination degree is 1 cm or more, is marked.

Embodiment 1

3 w % of bisphenol-F, 3 w % of o-cresol-novolak, 2 w % of 4,4'oxybis(N-(4-(oxiran-2-ylmethoxy)benzylidene)aniline), 2% of NC-3000H epoxy resin (Nippon Kayaku co., Ltd), 2 w % of a DAS curing agent, 2 w % of a DAS curing accelerator, 0.5 wt % of BYK-W980, and 2.5 w % of epoxy adducts expressed in chemical formula 2 were mixed with each other and stirred at the temperature of 40 for 10 mins. Thereafter, 85 w % of an alumina inorganic filler was introduced into the mixture and stirred at the room temperature during 20 mins to 30 mins to obtain the crystalline epoxy resin compound of embodiment 1.

Embodiment 2

3 w % of bisphenol-F, 2 w % of 4,4'oxybis(N-(4-(oxiran-2-ylmethoxy)benzylidene)aniline), 1.5 w % of NC-3000H epoxy resin (Nippon Kayaku co., Ltd), 1 w % of a DAS curing agent, 1.5 w % of epoxy adducts expressed in chemical formula 2, and 0.5 wt % of BYK-W980 were mixed with each other and stirred at the temperature of 40 for 10 mins. Thereafter, 88 w % of an alumina inorganic filler was introduced into the mixture and stirred at the room temperature during 20 mins to 30 mins to obtain the crystalline epoxy resin compound of embodiment 2.

Embodiment 3

2 w % of bisphenol-F, 2 w % of o-cresol-novolak, 1 w % of 4,4'oxybis(N-(4-(oxiran-2-ylmethoxy)benzylidene)aniline), 2 w % of NC-3000H epoxy resin (Nippon Kayaku co., Ltd), 1 w % of a DAS curing agent, 1.5 w % of epoxy adducts expressed in chemical formula 2, 0.5 wt % of BYK-W980 were mixed with each other and stirred at the temperature of 40 for 10 mins. Thereafter, 90 w % of an alumina inorganic filler was introduced into the mixture and stirred at the room temperature during 20 mins to 30 mins to obtain the crystalline epoxy resin compound of embodiment 3.

Embodiment 4

2 w % of bisphenol-F, 1 w % of o-cresol-novolak, 1 w % of 4,4'oxybis(N-(4-(oxiran-2-ylmethoxy)benzylidene)aniline), 1 w % of NC-3000H epoxy resin (Nippon Kayaku co., Ltd), 1 w % of a DAS curing agent, 0.5 wt % of BYK-W980, 1.5 w % of epoxy adducts expressed in chemical formula 2 were mixed with each other and stirred at the temperature of 40 for 10 mins. Thereafter, 92 w % of an alumina inorganic filler was introduced into the mixture and stirred at the room temperature during 20 mins to 30 mins to obtain the crystalline epoxy resin compound of embodiment 4.

Embodiment 5

3 w % of bisphenol-F, 3 w % of o-cresol-novolak, 2 w % of 4,4'oxybis(N-(4-(oxiran-2-ylmethoxy)benzylidene)aniline), 2 w % of NC-3000H epoxy resin (Nippon Kayaku co., Ltd), 2 w % of a DAS curing agent, 0.5 wt % of BYK-W980, 2.5 w % of epoxy adducts expressed in chemical formula 3 were mixed with each other and stirred at the temperature of 40 for 10 mins. Thereafter, 85 w % of an alumina inorganic filler was introduced into the mixture and stirred at the room temperature during 20 mins to 30 mins to obtain the crystalline epoxy resin compound of embodiment 5.

Embodiment 6

3 w % of bisphenol-F, 2 w % of o-cresol-novolak, 1.5 w % of 4,4'oxybis(N-(4-(oxiran-2-ylmethoxy)benzylidene) aniline), 2 w % of NC-3000H epoxy resin (Nippon Kayaku co., Ltd), 1 w % of a DAS curing agent, 0.5 wt % of BYK-W980, 2 w % of epoxy adducts expressed in chemical formula 3 were mixed with each other and stirred at the temperature of 40 for 10 mins. Thereafter, 88 w % of an alumina inorganic filler was introduced into the mixture and stirred at the room temperature during 20 mins to 30 mins to obtain the crystalline epoxy resin compound of embodiment 6.

Embodiment 7

2 w % of bisphenol-F, 2 w % of o-cresol-novolak, 1 w % of 4,4'oxybis(N-(4-(oxiran-2-ylmethoxy)benzylidene)aniline), 2 w % of NC-3000H epoxy resin (Nippon Kayaku co., Ltd), 1 w % of a DAS curing agent, 0.5 wt % of BYK-W980, 1.5 w % of epoxy adducts expressed in chemical formula 3 were mixed with each other and stirred at the temperature of 40 for 10 mins. Thereafter, 90 w % of an alumina inorganic filler was introduced into the mixture and stirred at the room temperature during 20 mins to 30 mins to obtain the crystalline epoxy resin compound of embodiment 7.

Embodiment 8

2 w % of bisphenol-F, 1 w % of o-cresol-novolak, 1 w % of 4,4'oxybis(N-(4-(oxiran-2-ylmethoxy)benzylidene)aniline), 1 w % of NC-3000H epoxy resin (Nippon Kayaku co., Ltd), 1 w % of a DAS curing agent, 0.5 wt % of BYK-W980, 1.5 w % of epoxy adducts expressed in chemical formula 3 were mixed with each other and stirred at the temperature of 40 for 10 mins. Thereafter, 92 w % of an alumina inorganic filler was introduced into the mixture and stirred at the room temperature during 20 mins to 30 mins to obtain the crystalline epoxy resin compound of embodiment 8.

Comparative Example 1

3 w % of bisphenol-F, 2 w % of o-cresol-novolak, 2 w % of 4,4'oxybis(N-(4-(oxiran-2-ylmethoxy)benzylidene)aniline) of epoxy resin, 1 w % of a imidazole curing agent, 1.5 w % of an imidazole curing accelerator and 0.5 wt % of BYK-W980 (additive) were mixed with each other and stirred at the temperature of 40 for 10 mins. Thereafter, 90 w % of an alumina inorganic filler was introduced into the mixture and stirred at the room temperature during 20 mins to 30 mins to obtain the crystalline epoxy resin compound of embodiment 3 and comparative example 1.

Comparative Example 2

10.3 w % of bisphenol-F, 2 w % of o-cresol-novolak, 1 w % of 4,4'oxybis(N-(4-(oxiran-2-ylmethoxy)benzylidene) aniline), 1 w % of NC-3000H epoxy resin (Nippon Kayaku co., Ltd), 1 w % of an imidazole curing agent, 1.5 w % of an imidazole curing accelerator and 0.5 wt % of BYK-W980 (additive) were mixed with each other and stirred at the temperature of 40 for 10 mins. Thereafter, 90 w % of an alumina inorganic filler was introduced into the mixture and stirred at the room temperature during 20 mins to 30 mins to obtain the crystalline epoxy resin compound of embodiment 3 and comparative example 2.

Experimental Example

Thermal Conductivity Measurement

The thermal conductivity of each embodiment and each comparative example was measured through an abnormal heat conduction scheme by using an LFA447-type thermal conductivity meter manufactured by NETZSCH and shown in Table 1.

Al Peel Property

An Al peel property was represented as the delmaination degree of an epoxy resin compound when the epoxy resin compound was coated on an Al substrate and cured, and then the Al substrate was bent at 180 degrees and recovered at an original position. If the delamination degree is less than 0.2 cm, is marked. If the delamination degree is in the range of 0.2 cm to 1 cm, is marked. If the delamination degree is 1 cm or more, is marked. The Al peel property was shown in Table 1.

TABLE 1

| Experiment No. | Thermal Conductivity (W/mK) | Al peel |
|---|---|---|
| Embodiment 1 | 4.21 | |
| Embodiment 2 | 4.62 | |
| Embodiment 3 | 5.13 | |
| Embodiment 4 | 4.99 | x |
| Embodiment 5 | 3.99 | |
| Embodiment 6 | 4.05 | |
| Embodiment 7 | 5.01 | |
| Embodiment 8 | 4.98 | x |
| Comparative Example 1 | 3.99 | |
| Comparative Example 2 | 3.79 | |

As shown in Table 1, the case of embodiment 7 has higher thermal conductivity than the case of comparative example 1 having the same amount of the alumina.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. An epoxy resin composition comprising
an epoxy resin comprising a crystalline epoxy resin and a non-crystalline epoxy resin,
a curing agent, and

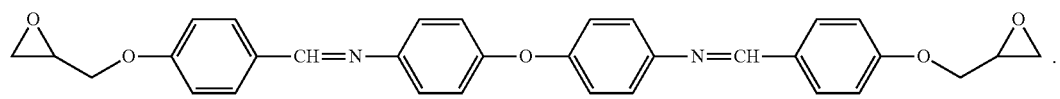

an inorganic filler,
wherein the curing agent comprises epoxy adducts,
wherein the crystalline epoxy resin includes a mesogen structure,
wherein the epoxy resin comprises at least 50 w % of the crystalline epoxy resin,
wherein the epoxy resin composition comprises 0.5 w % to 5 w % of the epoxy adducts based on a total weight of the epoxy resin composition, acid
wherein the epoxy adducts are represented by following chemical formula 1 or chemical formula 2:

chemical formula 1

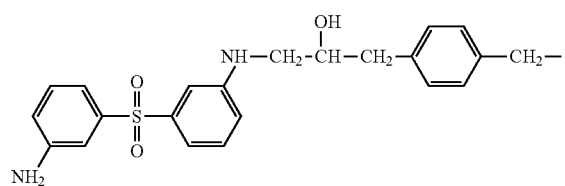

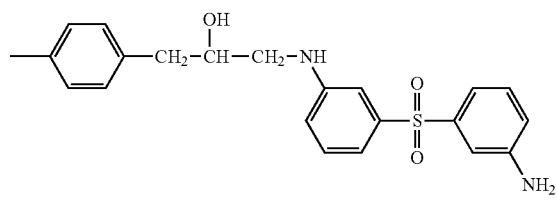

2. The epoxy resin composition of claim 1, wherein the crystalline epoxy resin is represented by the following chemical formula:

chemical formula 2

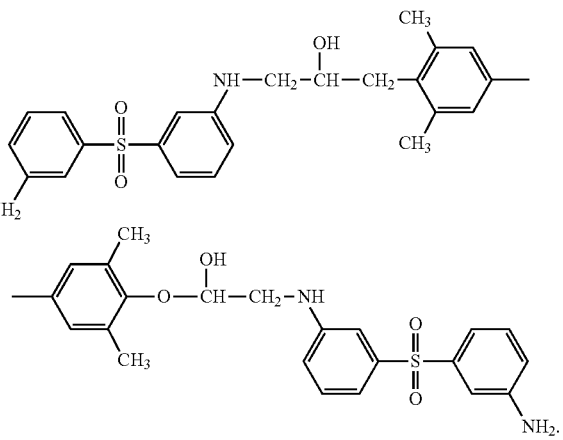

3. The epoxy resin composition of claim 1, wherein the epoxy resin composition comprises 40 w % to 95 w % of the inorganic filler based on a total weight of the epoxy resin composition.

4. The epoxy resin composition of claim 1, wherein the inorganic filler includes at least one selected from the group consisting of alumina, boron nitride, aluminum nitride, crystalline silica, and silicon nitride.

5. The epoxy resin composition of claim 1, wherein the epoxy resin composition comprises 3 w % to 60 w % of the epoxy resin based on a total weight of the epoxy resin composition.

6. The epoxy resin composition of claim 1, wherein the epoxy resin composition has a thermal conductivity of at least 4.0 W/mK.

7. The epoxy resin composition of claim 1, further comprising a curing accelerator and a coupling agent.

8. A radiant circuit board comprising:
a metallic plate;
an insulating layer on the metallic plate; and
a circuit pattern on the insulating layer,
wherein the insulating layer is formed by curing an epoxy resin composition comprising an epoxy resin comprising both a crystalline epoxy resin and a non-crystalline epoxy resin, a curing agent, and an inorganic filler, and wherein the curing agent comprises epoxy adducts;
wherein the crystalline epoxy resin includes a mesogen structure,
wherein the epoxy resin comprises at least 50 w % of the crystalline epoxy resin,
wherein the epoxy resin composition comprises 0.5 w % to 5 w % of the epoxy adducts based on a total weight of the epoxy resin composition, wherein the epoxy adducts are represented by following chemical formula 1 or chemical formula 2:

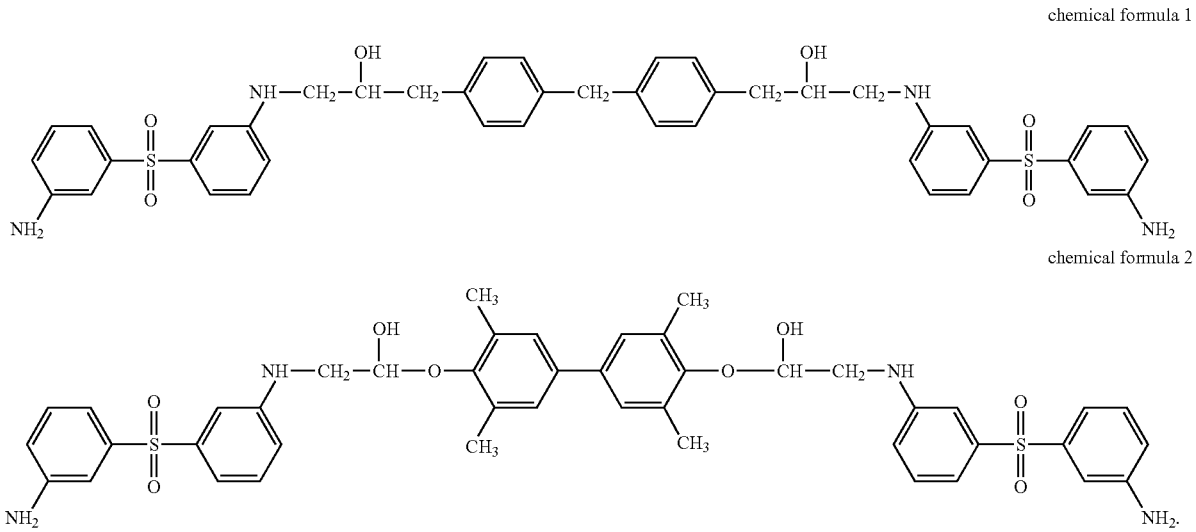

chemical formula 1 chemical formula 2

9. The radiant circuit board of claim 8, wherein the epoxy resin composition comprises 40 w % to 95 w % of the inorganic filler based on a total weight of the epoxy resin composition.

10. The radiant circuit board of claim 8, wherein the inorganic filler includes at least one selected from the group consisting of alumina, boron nitride, aluminum nitride, crystalline silica, and silicon nitride.

* * * * *